United States Patent
Kennedy et al.

(10) Patent No.: US 11,750,945 B2
(45) Date of Patent: Sep. 5, 2023

(54) IMAGER WITH INTEGRATED ASYNCHRONOUS LASER PULSE DETECTION HAVING A SIGNAL COMPONENT ALONG A SECOND ELECTRICAL PATHWAY PASSES THROUGH AN ALPD READOUT INTEGRATED CIRCUIT TO AN IMAGING READOUT INTEGRATED CIRCUIT

(71) Applicant: RAYTHEON COMPANY, Waltham, MA (US)

(72) Inventors: Adam M. Kennedy, Santa Barbara, CA (US); Michael J. Batinica, Ventura, CA (US); Scott M. Taylor, Goleta, CA (US); Sean P. Kilcoyne, Lompoc, CA (US); Paul Bryant, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 210 days.

(21) Appl. No.: 16/749,004

(22) Filed: Jan. 22, 2020

(65) Prior Publication Data
US 2021/0227158 A1    Jul. 22, 2021

(51) Int. Cl.
  *G01J 1/44* (2006.01)
  *H04N 25/702* (2023.01)
  *H04N 25/75* (2023.01)

(52) U.S. Cl.
  CPC .............. *H04N 25/702* (2023.01); *G01J 1/44* (2013.01); *H04N 25/75* (2023.01)

(58) Field of Classification Search
  CPC ........ H04N 5/3696; H04N 5/378; H04N 5/04; H04N 5/05; H04N 5/06; H04N 5/12;
  (Continued)

(56) References Cited

U.S. PATENT DOCUMENTS 9,215,386 B2   12/2015  Elkind et al.
2004/0004707 A1*  1/2004  DeFlumere ........... G01S 7/4816
                                              356/4.01
(Continued)

FOREIGN PATENT DOCUMENTS

EP    2816312 A3    1/2015
WO    2019041267 A1    3/2019

OTHER PUBLICATIONS

Berkowicz, et al.; "High Definition 10pm pitch InGaAs detector with Asynchronous Laser Pulse Detection mode" Proc. of SPIE vol. 9819 981903-2, Infrared Technology and Applications XLII, 981903 (May 20, 2016); Baltimore, Maryland, USA; 9 Pages; doi: 10.1117/12.2222762.

(Continued)

*Primary Examiner* — Que Tan Le
(74) *Attorney, Agent, or Firm* — CANTOR COLBURN LLP

(57) ABSTRACT

An imaging and asynchronous laser pulse detector (ALPD) device, imaging cell of the imaging and ALPD device and method of use is disclosed. A detector generates an electrical signal in response to receiving an optical signal, wherein a frequency of the electrical signal is indicative of a frequency of the optical signal. A first detection/readout circuit is sensitive to a first frequency range, and a second detection/readout circuit is sensitive to a second frequency range. The first detection/readout circuit allows the electrical signal to pass from the first detection/readout circuit to the second detection/readout circuit.

12 Claims, 3 Drawing Sheets

(58) Field of Classification Search
CPC .......... H04N 25/75; H04N 25/00; H04N 5/38;
H04N 5/30; H04N 5/126; H04N 5/123;
G01J 1/44; H01L 27/14634; F41G 3/145;
F41G 7/2293; F41G 7/226; F41G 7/2253;
F41G 7/008; G01S 17/02; G01S 17/04;
G01S 17/10; G01S 17/06; G01S 17/86
USPC ...................................................... 250/214 R
See application file for complete search history.

(56) References Cited

U.S. PATENT DOCUMENTS

| | | | | |
|---|---|---|---|---|
| 2012/0248288 | A1* | 10/2012 | Linder | F41G 7/008 250/214 R |
| 2012/0261553 | A1* | 10/2012 | Elkind | H04N 5/335 250/208.1 |
| 2012/0305786 | A1* | 12/2012 | Dierickx | G01J 1/44 250/371 |
| 2015/0163401 | A1* | 6/2015 | Botts | H04N 5/332 348/231.99 |
| 2016/0054434 | A1* | 2/2016 | Williams | G01S 17/10 356/5.01 |
| 2016/0293647 | A1* | 10/2016 | Lin | H01L 27/14643 |
| 2018/0041727 | A1* | 2/2018 | Lund | H04N 5/3765 |
| 2019/0113605 | A1* | 4/2019 | Liobe | H04N 5/3745 |

OTHER PUBLICATIONS

Dvinelis, et al.; "Laser illumination and EO systems for covert surveillance from NIR to SWIR and beyond"; Proc. of SPIE vol. 9987 998703-1; Electro-Optical and Infrared Systems: Technology and Applications XIII, 998703 (Oct. 21, 2016); Edinburgh, United Kingdom; 9 Pages, doi: 10.1117/12.2238791.

International Search Report and Written Opinion for International Application No. PCT/US2020/060845; International Filing Date Nov. 17, 2020; dated Jul. 15, 2021; 15 Pages.

Langof, et al.; "Advanced multi function infrared detector with on-chip processing"; Proc. of SPIE vol. 8012 80120F-1; Infrared Technology and Applications XXXVII, 80120F (May 20, 2011); Orlando, Florida, USA; 14 Pages; doi: 10.1117/12.883248.

Quantum Imaging; ; QI-SWIR-HD10; High-Definition, Miniature SWIR Camera; a SCD USA Company; Quantum Imaging, Inc.; Colorado Springs, CO; 2 Pages. URL: https://quantumimaging.com/.

* cited by examiner

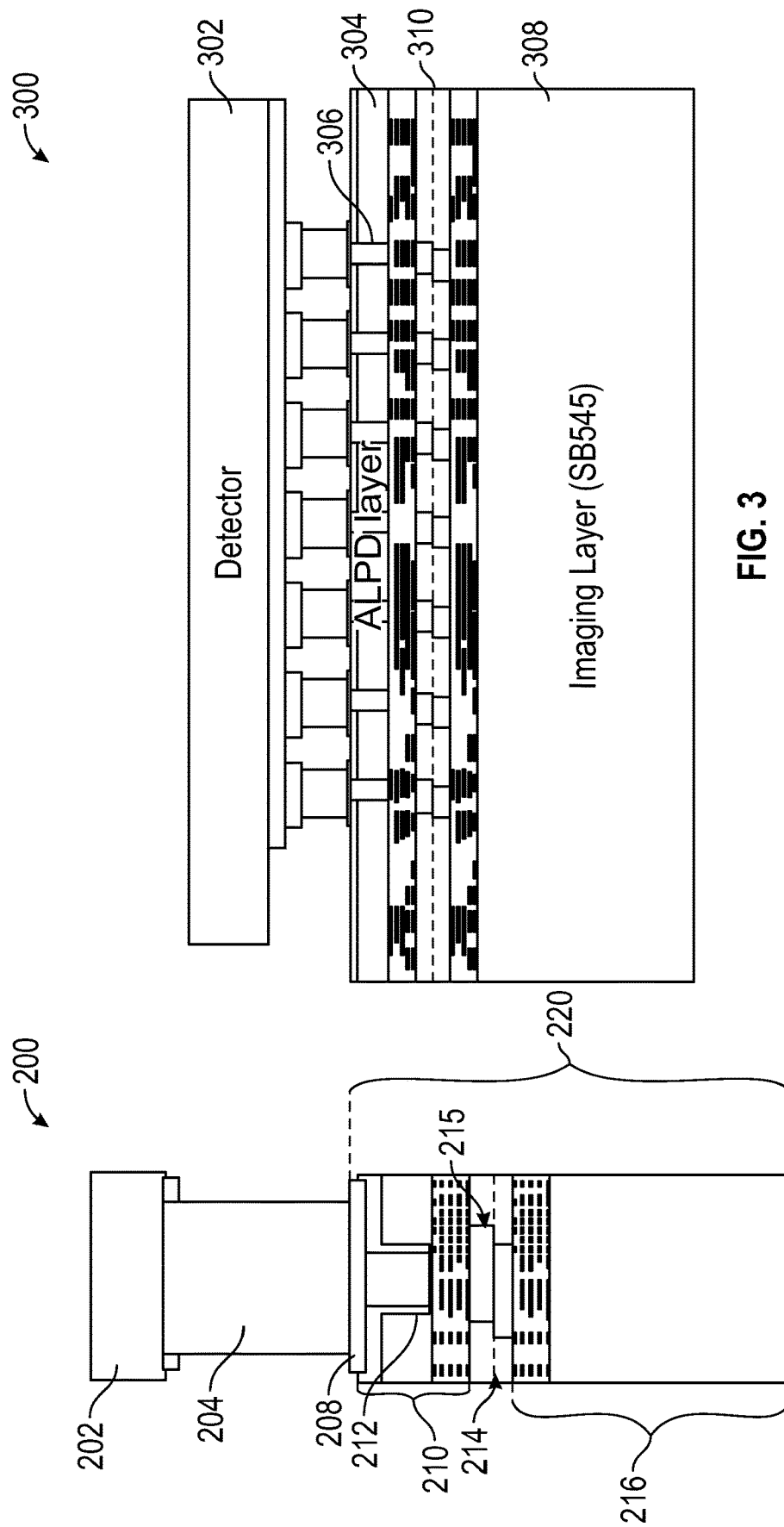

IMAGER WITH INTEGRATED ASYNCHRONOUS LASER PULSE DETECTION HAVING A SIGNAL COMPONENT ALONG A SECOND ELECTRICAL PATHWAY PASSES THROUGH AN ALPD READOUT INTEGRATED CIRCUIT TO AN IMAGING READOUT INTEGRATED CIRCUIT

BACKGROUND

The present disclosure relates to imaging systems and methods for obtaining an image and, in particular, to a system for separately recording imaging signals and laser pulse signals that are received along a same optical pathway.

Some passive imaging devices can be used to detect a laser pulse to locate designated objects and overlay the spot on the displayed image. Imaging devices generally employ a separate laser detector for detecting a laser pulse along a first optical path and an image detector for detecting imaging signals along a second optical path, thereby requiring greater packaging volume to accommodate the two optical paths. To reduce packaging volume requirements, there is a need to be able to receive the laser pulse and the imaging signal along a single optical path.

SUMMARY

According to one embodiment of the present disclosure, a method of obtaining an image is disclosed. An optical signal is received at a detector. An electrical signal is generated at the detector in response to receiving the optical signal, wherein a frequency of the electrical signal is indicative of a frequency of the optical signal. The electrical signal is received at a first detection/readout circuit which is sensitive to specific frequency signal range. The signal is allowed to pass from the first detection/readout circuit to a second detection readout circuit that is sensitive to a different selected frequency range.

According to another embodiment of the present disclosure, an imaging and asynchronous laser pulse detector (ALPD) device is disclosed. The imaging and ALPD device includes a detector configured to generate an electrical signal in response to receiving an optical signal, wherein a frequency of the electrical signal is indicative of a frequency of the optical signal, a first detection/readout circuit sensitive to a first frequency range, and a second detection/readout circuit sensitive to a second frequency range. The first detection/readout circuit is configured to allow a component of the electrical signal to pass from the first detection/readout circuit to the second detection/readout circuit.

According to yet another embodiment of the present disclosure, an imaging cell of an imaging and asynchronous laser pulse detector (ALPD) device is disclosed. The imaging cell includes a detector configured to generate an electrical signal in response to receiving an optical signal, wherein a frequency of the electrical signal is indicative of a frequency of the optical signal, a first detection/readout circuit, and a second detection/readout circuit. The first detection/readout circuit is configured to allow a component of the electrical signal to pass from the first detection/readout circuit to the second first detection/readout circuit.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

FIG. 2 shows a side view of an illustrative imaging cell used in the imaging device of FIG. 1;

FIG. 3 shows an imaging device including a plurality of the imaging cells of FIG. 2, forming an array of imaging pixels.

DETAILED DESCRIPTION

The present invention provides a device having the ability to independently observe a high frequency signal and a low frequency signal with a same co-located pixel as well as a method of operating the device. The apparatus provides a single optical path for both a laser pulse and optical scene image. Thus, a laser spot can be seen that is co-located with an actual image where a high frequency input (such as from a laser, for example) does not interfere with a low frequency inputs (such as an infrared image, for example). In addition, the high frequency input can contain temporal information such as a specific code to identify the laser source or communication information. This high frequency input can be detected and read out by the circuit without disturbing the low frequency input. The high frequency input can be decoded and/or interpreted in a high frequency portion of a circuit of the apparatus. Thus, a laser code for a target designator can be read at the device to determine if a specific laser is being used to designate a target, while at the same time an observer can use the device to continuously view a scene or target in full detail without being obstructed by the laser signal. The present invention electrically isolates the high frequency input from an asynchronous laser pulse signal from the low frequency input from a nearly constant imaging signal. A fast laser rise/fall time maximizes isolation of the high frequency input, while a low pass imager buffer helps to minimize the amount of the laser pulse that gets into the image. A low pass filter (LPF) is used to provide high AC attenuation while a high pass filter (HPF) is used to provide high DC attenuation. In one embodiment, the circuit for reading the high frequency input includes an asynchronous laser pulse detection (ALPD) circuit.

Figure 1:
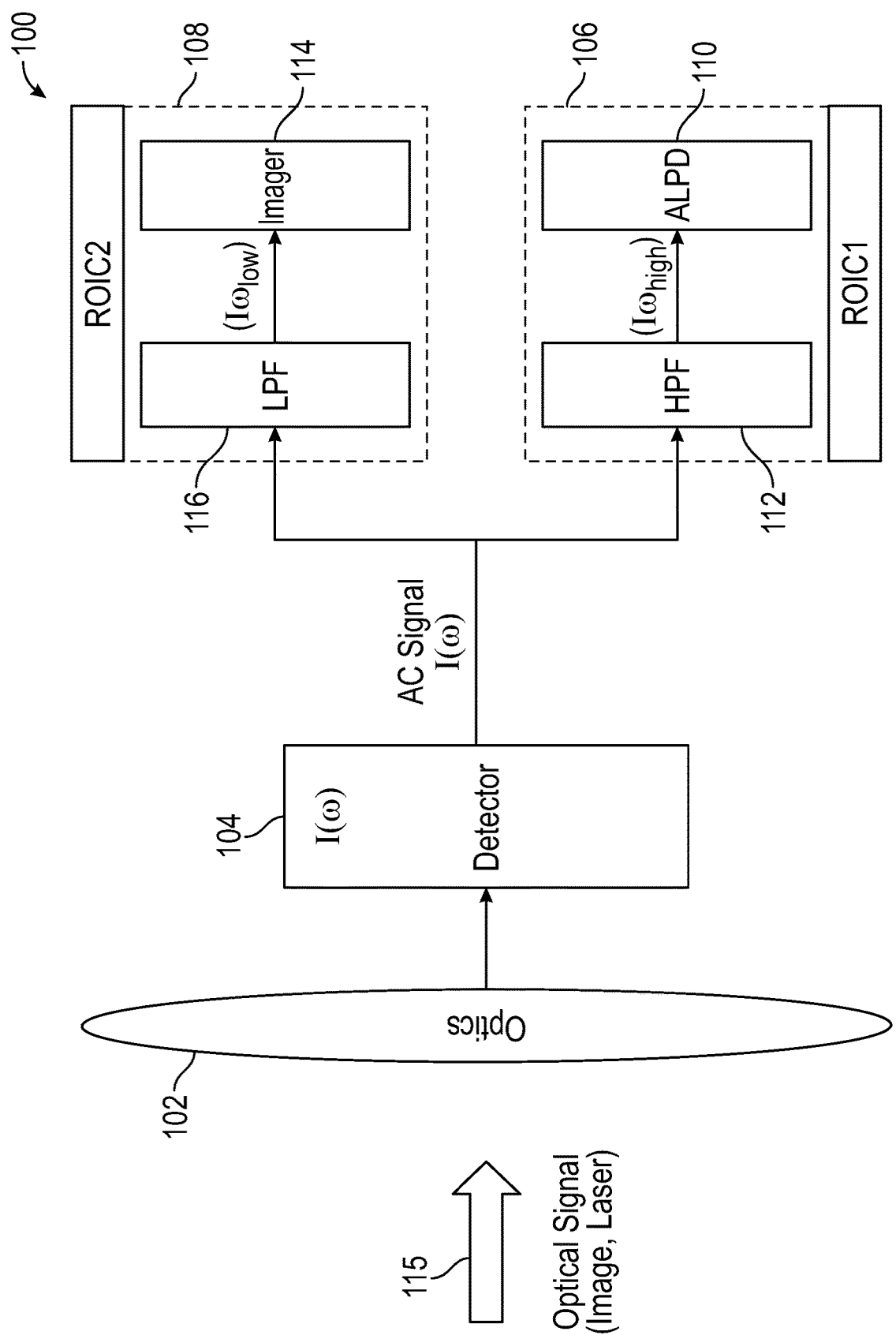
FIG. 1 shows a schematic diagram illustrating an imaging and ALPD (asynchronous laser pulse detection) device in an embodiment.

FIG. 1 shows a block diagram illustrating an imaging and ALPD (asynchronous laser pulse detector) device 100 in an embodiment. The imaging and ALPD device 100 includes an optical lens system 102, a detector 104 such as a photodetector, a first detection/readout integrated circuit (ROIC1) 106 and a second detection/readout integrated circuit (ROIC2) 108. In various embodiments, the first detection/readout circuit 106 includes a high pass frequency filter (HPF) 112 and an asynchronous laser pulse detector (ALPD) 110 for detecting and recording fast or high-frequency laser pulses. The second detection/readout integrated circuit 108 includes a low pass frequency filter (LPF) 116 and integrating circuits 114 for integrating slow or low-frequency image signals. The optical lens system 102 focuses an optical signal 115 at the detector 104, which has a much higher frequency response than the frequency content of the laser pulse. The detector 104 receives the optical signal 115 and, in response, generates an electrical signal. The frequency content of the electrical signal is related to the type of optical signal received at the sensor 102. In various embodiments, the optical signal 115 can be a laser pulse or an imaging signal, or a combination thereof. A laser pulse generates a signal current with high frequency components, such as in the range of 10 MHz while an imaging signal generally has a low frequency signal current less than about 1 MHz, such as from about 0 Hz to about 100 Hz. In response to receiving a laser pulse, the detector 104 generates an electrical signal having a frequency within a first (high) frequency range. In response to receiving an imaging signal, the detector 104 generates an electrical signal having a frequency within a second (low) frequency range. In various embodiments, the electric signal can include both high frequency and low frequency components.

The electrical signal is received at both the first detection/readout integrated circuit 106 and the second detection/readout integrated circuit 108. The first detection/readout integrated circuit 106 includes a circuit that couples electrical signals within the first frequency range to the first detection/readout integrated circuit 106 the second detection/readout integrated circuit 108 has a circuit that couples electrical signals within the second frequency range. In particular, the electrical signal $I(\omega)$ from the detector 104 can have both high-frequency $I(\omega_{high})$ and low-frequency $I(\omega_{low})$ components. These high frequency component couples into ROIC1 106 via high pass frequency filter (HPF) 112 and the low frequency component couples into ROIC2 108 via low pass frequency filter (LPF) 116. Thus, the high-frequency component $I(\omega_{high})$ of the electrical signal (e.g., a laser pulse) is received at the first detection/readout circuit 106 and the low-frequency component $I(\omega_{low})$ of the electrical signal (e.g., an imaging signal) is received at the second detection/readout circuit 108.

FIG. 2 shows a side view of an illustrative imaging and ALPD cell 200 used in the imaging and ALPD device 100 of FIG. 1. The imaging and ALPD cell 200 includes a detector 202 adjoined to electronic circuits 220 via an electrical connection such as an indium bump 204 and interconnect metal 208. The detector 202 can be made of a photosensitive material such as Indium-Gallium-Arsenide (InGaAs) or Mercury-Cadmium Telluride (HgCdTe), for example. A via 212 provides the electrical signal from the detector 202 to the integrated circuit 220. The integrated circuit 220 includes a first detection/readout circuit 210 (e.g., an asynchronous laser pulse detector readout integrated circuit (ALPD ROIC)) coupled to a second detection/readout circuit 216 (e.g., an imaging readout integrated circuit (imaging ROIC)), with the first detection/readout circuit 210 interconnected to the second detection/readout circuit 216 using a suitable bonding technique. In one non-limiting embodiment, the bonding technique can include direct bond hybridization (DBH). The top of the imaging and ALPD cell 200 is indicated by the location of the detector 202. An electrically isolating layer 214 is formed between the first detection/readout circuit 210 and the second detection/readout circuit 216 to provide an electrical isolation between the readout circuits. At least one electrically conductive path 215 passes through the first detection/readout circuit 210 and the electrically isolating layer 214 to provide an electrical signal through the first detection/readout circuit 210 to the second detection/readout circuit 216. In various embodiments, the first detection/readout circuit 210 forms an ALPD layer of the integrated circuit 220 and the second detection/readout circuit 216 forms an imaging layer of the integrated circuit 220. The first detection/readout circuit 210 includes at least one ALPD pixel and the second detection/readout circuit 216 includes at least one imaging pixel.

FIG. 3 shows an imaging and ALPD device 300 including a plurality of the imaging and ALPD cells 200 of FIG. 2, forming an array of imaging and ALPD pixels. The imaging and ALPD device 300 includes a detector 302, a first detection/readout circuit 304 (i.e., ALPD ROIC) having vias 306 passing through to a second detection/readout circuit 308 (i.e., imaging ROIC). The first detection/readout circuit 304 is electrically interconnected to the second detection/readout circuit 308 using a direct bond hybridization (DBH) layer 310 that isolates the two detection/readout circuits and interconnects the pixels with an embedded metal connection. The imaging pixels of the imaging ROIC are arranged to form a rectilinear array. Similarly, the ALPD pixels of the ALPD ROIC are arranged to from a rectilinear array.

The first detection/readout circuit 210 (i.e., the ALPD ROIC) can be fabricated with embedded through silicon vias (TSVs) 306 below the active circuitry of the detector during fabrication. The ALPD ROIC can then by placed in the imaging and ALPD device 300 in a standard state in which the detector is attached to the bottom of the ALPD ROIC or an inverted state in which the detector is attached to the top of the ALPD ROIC.

Figure 4A:
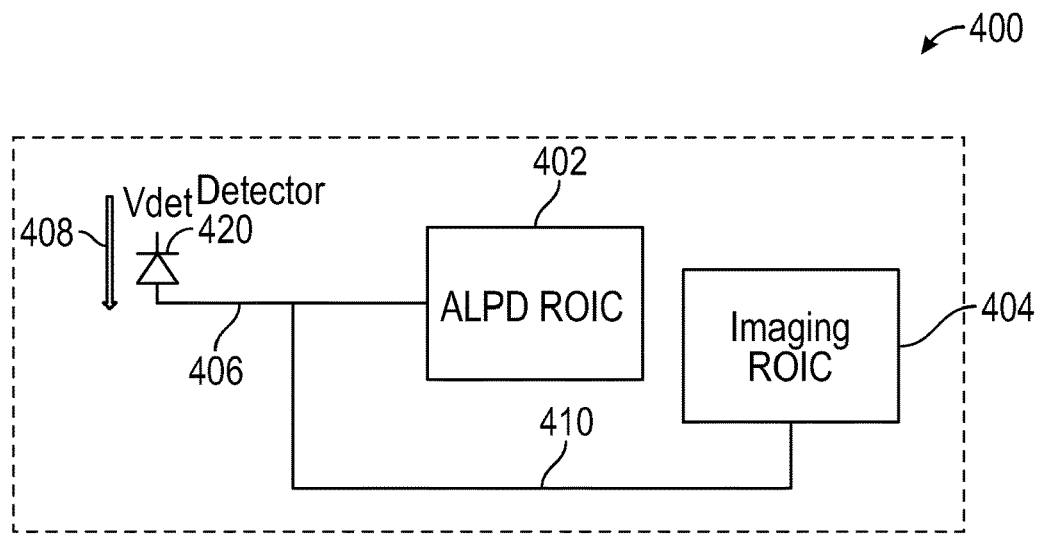
FIG. 4 shows a schematic view of an imaging device in an embodiment.
Figure 4B:
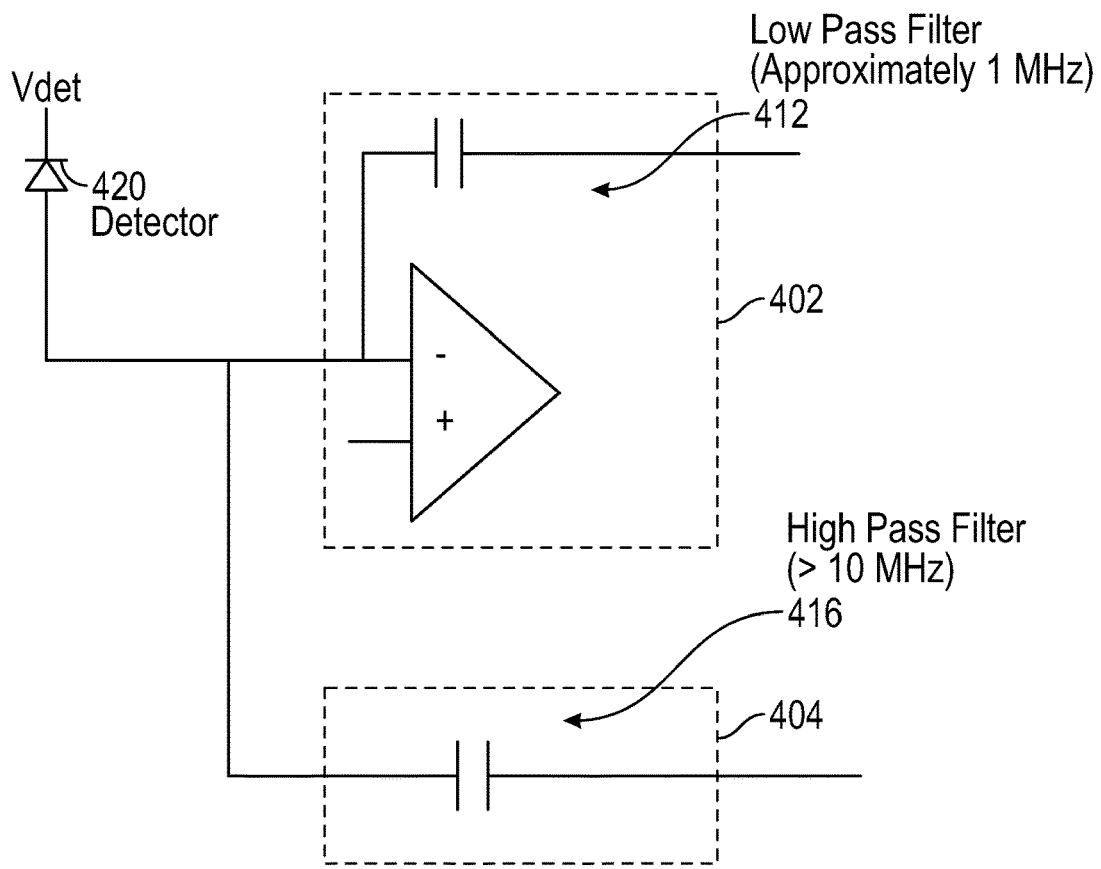

FIG. 4a shows a schematic view of an imaging and ALPD device 400 in an embodiment. The imaging and ALPD device 400 includes a first detection/readout circuit 402 (i.e., ALPD ROIC) and a second detection/readout circuit 404 (i.e., imaging ROIC). The signal in 406 travels to the first detection/readout circuit 402 which includes a trace 410 for allowing electrical signals to go to the second detection/readout circuit 404. An electrical signal 408 received from the detector 420 is received at the first detection/readout circuit 402 via a first electrical pathway 406 connecting the detector 420 to the detection/readout circuit 402. The electrical signal 402 can include signal components over a wide frequency range above 1 kHz, in various embodiments. The circuits are designed such that the high frequency components are captured in 402. The circuit trace 410 routes the electrical signal to 404 which is designed to sense the low frequency component of the signal. FIG. 4b shows this concept as an electrical diagram where a high pass filter 412 is contained in ALPD ROIC 402 and a low pass filter 416 is contained in imaging ROIC 404.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for exemplary embodiments with various modifications as are suited to the particular use contemplated.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of obtaining an image, comprising:
   receiving an optical signal at a detector;
   generating, at the detector, an electrical signal in response to receiving the optical signal, wherein a frequency of the electrical signal is indicative of a frequency of the optical signal;
   receiving the electrical signal at a first detection/readout circuit and at a second detection/readout circuit, wherein the first detection/readout circuit is sensitive to a first frequency signal range of a laser and the second detection/readout circuit is sensitive to a second frequency signal range of an imaging signal;
   filtering the electrical signal at a high pass filter contained in the first detection/readout circuit to pass an asynchronous signal component within the first frequency signal range to an asynchronous laser pulse detector (ALPD) readout integrated circuit of the first detection-readout circuit;
   reading the signal component within the first frequency signal range at the ALPD readout integrated circuit;
   filtering the electrical signal at a low pass filter of contained in the second detection/readout circuit to pass a signal component within the second frequency signal range to an imaging readout integrated circuit of the second detection/readout circuit; and
   reading the signal component within the second frequency signal range at the imaging readout integrated circuit,
   wherein the first detection/readout circuit resides on top of the second detection/readout circuit and wherein the electrical signal passes along a first electrical pathway that leads from the detector to the first detection/readout circuit and the signal component within the second frequency signal range passes along a second electrical pathway that passes through the ALPD readout intergrated circuit to the imaging readout integrated circuit.

2. The method of claim 1, wherein the optical signal includes at least one of a laser signal and an imaging signal that traverse a same optical path to the detector.

3. The method of claim 2, further comprising generating the electrical signal within a first frequency range in response to receiving the laser signal and generating the electrical signal with a second frequency lower than the first frequency in response to receiving the imaging signal.

4. The method of claim 1, wherein the first detection/readout circuit is electrically isolated from the second detection/readout circuit.

5. An imaging and asynchronous laser pulse detector (ALPD) device, comprising:
   a detector configured to generate an electrical signal in response to receiving an optical signal, wherein a frequency of the electrical signal is indicative of a frequency of the optical signal;
   a first detection/readout circuit sensitive to a first frequency range of a laser, the first detection/readout circuit having a first filter contained therein for passing an asynchronous signal component of the electrical signal within the first frequency signal range and an asynchronous laser pulse detector (ALPD) readout integrated circuit for reading the signal component within the first frequency signal range;
   a second detection/readout circuit sensitive to a second frequency range of an imaging signal, the second detection/readout circuit having a second filter contained therein for passing a signal component of the electrical signal within the second frequency signal range and an imaging readout integrated circuit for reading the signal component within the second frequency signal range;
   wherein the first detection/readout circuit resides on top of the second detection/readout circuit;
   a first electrical pathway that passes the electrical signal from the detector to the first detection/readout circuit; and
   a second electrical pathway that passes through the ALPD readout integrated circuit to the imaging readout integrated circuit, wherein the signal component within the second frequency signal range passes along the second electrical pathway.

6. The imaging and ALPD device of claim 5, wherein the optical signal includes at least one of a laser signal and an imaging signal that traverse a same optical path to be received at the detector.

7. The imaging and ALPD device of claim 6, wherein the detector is further configured to generate the electrical signal within the first frequency range in response to receiving the laser signal and generate the electrical signal with a second frequency lower than the first frequency in response to receiving the imaging signal.

8. The imaging and ALPD device of claim 5, further comprising an electrical isolation layer between the first detection/readout circuit and the second detection/readout circuit.

9. An imaging cell of an imaging and asynchronous laser pulse detector (ALPD) device, comprising:
   a detector configured to generate an electrical signal in response to receiving an optical signal, wherein a frequency of the electrical signal is indicative of a frequency of the optical signal;
   a first detection/readout circuit sensitive to a first frequency range of a laser, the first detection/readout circuit having a first filter contained therein for passing an asynchronous signal component of the electrical signal within the first frequency signal range and an ALPD readout integrated circuit for reading the signal component within the first frequency signal range;
   a second detection/readout circuit sensitive to a second frequency range of an imaging signal, the second detection/readout circuit having a second filter contained therein for passing a signal component of the electrical signal within the second frequency signal range and an imaging readout integrated circuit for reading the signal component within the second frequency signal range;

wherein the first detection/readout circuit resides on top of the second detection/readout circuit;

a first electrical pathway that passes the electrical signal from the detector to the first detection/readout circuit; and a second electrical pathway that passes through the ALPD readout integrated circuit to the imaging readout integrated circuit, wherein the signal component within the second frequency signal range passes along the second electrical pathway.

10. The imaging cell of claim 9, wherein the optical signal includes at least one of a laser signal and an imaging signal that traverse a same optical path to be received at the detector, and the detector is further configured to generate the electrical signal within the first frequency range in response to receiving the laser signal and generate the electrical signal with a second frequency lower than the first frequency in response to receiving the imaging signal.

11. The imaging cell of claim 9, further comprising an electrical isolation layer between the first detection/readout circuit and the second detection/readout circuit.

12. The method of claim 1, wherein the first frequency signal range is about 10 Megahertz (MHz) and the second frequency signal range is less than 1 MHz.

* * * * *